United States Patent
Emami

(10) Patent No.: US 6,786,996 B2
(45) Date of Patent: Sep. 7, 2004

(54) APPARATUS AND METHOD FOR EDGE BEAD REMOVAL

(75) Inventor: Ramin Emami, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 284 days.

(21) Appl. No.: 09/978,865

(22) Filed: Oct. 16, 2001

(65) Prior Publication Data

US 2003/0073309 A1 Apr. 17, 2003

(51) Int. Cl.[7] ............................................. H01L 21/306
(52) U.S. Cl. .............................. 156/345.1; 156/345.14; 156/345.21; 156/345.23; 156/345.51; 438/716
(58) Field of Search ......................... 156/345.1, 345.14, 156/345.21, 345.23, 345.51, 345.55

(56) References Cited

U.S. PATENT DOCUMENTS

| | | | |
|---|---|---|---|
| 4,339,297 A | 7/1982 | Aigo ........................... | 165/345 |
| 4,485,758 A | 12/1984 | Peugh et al. .................. | 118/52 |
| 4,510,176 A | 4/1985 | Cuthbert et al. .............. | 427/82 |
| 4,544,446 A | 10/1985 | Cady ........................... | 156/639 |
| 4,732,785 A | 3/1988 | Brewer ........................ | 427/240 |
| 4,788,994 A | 12/1988 | Shinbara ...................... | 134/157 |
| 4,903,717 A | 2/1990 | Sumnitsch .................... | 134/99 |
| 5,071,485 A | 12/1991 | Matthews et al. .............. | 134/2 |
| 5,294,257 A | 3/1994 | Kelly et al. ................... | 118/52 |
| 5,342,738 A | 8/1994 | Ikeda ........................... | 430/325 |
| 5,374,315 A * | 12/1994 | deBoer et al. ............... | 118/725 |
| 5,395,649 A | 3/1995 | Ikeda .......................... | 427/240 |
| 5,444,921 A | 8/1995 | Milina ......................... | 33/833 |
| 5,447,615 A * | 9/1995 | Ishida ...................... | 204/224 R |
| 5,513,668 A | 5/1996 | Sumnitsch .................... | 34/157 |
| 5,556,476 A * | 9/1996 | Lei et al. ..................... | 118/728 |
| 5,664,254 A | 9/1997 | Ohkura et al. .............. | 396/612 |
| 5,689,749 A | 11/1997 | Tanaka et al. .............. | 396/611 |
| 5,706,843 A | 1/1998 | Matsuo ........................ | 134/153 |
| 5,762,391 A * | 6/1998 | Sumnitsch ................ | 294/119.1 |
| 5,773,132 A | 6/1998 | Blumberg et al. .......... | 428/209 |

(List continued on next page.)

Primary Examiner—Nadine G. Norton
Assistant Examiner—Binh X. Tran
(74) Attorney, Agent, or Firm—Moser, Patterson & Sheridan

(57) ABSTRACT

The present invention generally provides an improved apparatus and method for removing an edge bead from a substrate. The apparatus includes a processing chamber having an edge bead removal fluid distribution system positioned therein and a substrate support member positioned in the processing chamber proximate the fluid distribution system. The substrate support member generally includes an upper substrate support surface having a plurality of fluid dispensing apertures formed therein, at least three capillary ring support posts radially positioned about a perimeter of the upper substrate support surface, and a annular capillary ring having a planar upper surface rigidly mounted to the capillary ring support posts. The substrate support member further includes at least three selectively extendable substrate support pin assemblies positioned proximate the annular capillary ring on the substrate support member, and at least three substrate gripper assemblies radially positioned about the perimeter of the upper substrate support surface. The method of the invention generally includes supporting a substrate in a face down position at a preferred capillary distance above an annular capillary ring with a plurality of selectively extendable substrate support pins and securing the substrate at the preferred capillary distance with a plurality of gripper assemblies. The method further includes rotating the substrate with the plurality of gripper assemblies, dispensing an edge bead removal solution onto a backside of the substrate, and generating a capillary flow of the edge bead removal solution in an area between a front surface of the substrate and an annular capillary ring that operates to remove the edge bead from the substrate.

21 Claims, 11 Drawing Sheets

U.S. PATENT DOCUMENTS

| | | | | |
|---|---|---|---|---|
| 5,845,170 A | 12/1998 | Ogata | | 396/604 |
| 5,851,041 A | 12/1998 | Anderson et al. | | 294/106 |
| 5,868,843 A | 2/1999 | Yang et al. | | 118/504 |
| 5,879,577 A | 3/1999 | Weng et al. | | 216/92 |
| 5,882,433 A | 3/1999 | Ueno | | 134/31 |
| 5,896,877 A | 4/1999 | Pirker | | 134/153 |
| 5,897,379 A | 4/1999 | Ulrich et al. | | 438/754 |
| 5,908,661 A | 6/1999 | Batcheldor et al. | | 427/240 |
| 5,916,631 A | 6/1999 | Mahneke | | 427/240 |
| 5,925,410 A | 7/1999 | Akram et al. | | 427/240 |
| 5,927,303 A | 7/1999 | Miya et al. | | 134/148 |
| 5,931,518 A | 8/1999 | Pirker | | 294/119.1 |
| 5,952,050 A | 9/1999 | Doan | | 427/336 |
| 5,964,954 A | 10/1999 | Matsukawa et al. | | 134/6 |
| 5,972,078 A | 10/1999 | Collins et al. | | 95/224 |
| 5,974,682 A | 11/1999 | Akimoto | | 34/66 |
| 5,979,475 A | 11/1999 | Satoh et al. | | 134/140 |
| 5,985,039 A | 11/1999 | Yonemizu et al. | | 134/2 |
| 5,989,342 A | 11/1999 | Ikeda et al. | | 118/52 |
| 6,012,858 A | 1/2000 | Konishi et al. | | 396/611 |
| 6,020,639 A | 2/2000 | Ulrich et al. | | 257/750 |
| 6,032,512 A | 3/2000 | Li | | 73/1.79 |
| 6,033,584 A | 3/2000 | Ngo et al. | | 216/67 |
| 6,050,275 A | 4/2000 | Kamikawa et al. | | 134/105 |
| 6,053,977 A | 4/2000 | Konishi | | 118/320 |
| 6,056,825 A | 5/2000 | Sumnitsch | | 118/730 |
| 6,059,879 A | 5/2000 | Gonzalez | | 117/92 |
| 6,103,096 A | 8/2000 | Datta et al. | | 205/686 |
| 6,126,338 A | 10/2000 | Akimoto | | 396/611 |
| 6,133,158 A | 10/2000 | Obeng et al. | | 438/745 |
| 6,136,163 A | 10/2000 | Cheung et al. | | 204/198 |
| 6,140,254 A | 10/2000 | Endisch et al. | | 438/787 |
| 6,143,155 A | 11/2000 | Adams et al. | | 205/87 |
| 6,150,269 A | 11/2000 | Roy | | 438/687 |
| 6,152,507 A | 11/2000 | Pirker | | 294/64.3 |
| 6,153,361 A | 11/2000 | Liu et al. | | 430/331 |
| 6,167,893 B1 | 1/2001 | Taatjes et al. | | 134/147 |
| 6,168,660 B1 | 1/2001 | Hayes et al. | | 118/52 |
| 6,193,798 B1 | 2/2001 | Sumnitsch | | 118/52 |
| 6,221,157 B1 | 4/2001 | Davis et al. | | 118/52 |
| 6,221,774 B1 | 4/2001 | Malik | | 438/690 |
| 6,267,853 B1 | 7/2001 | Dordi et al. | | 204/232 |
| 6,273,104 B1 | 8/2001 | Shinbara et al. | | 134/25.4 |
| 6,316,367 B1 * | 11/2001 | Sumnitsch | | 438/716 |
| 6,317,642 B1 | 11/2001 | You et al. | | 700/121 |
| 6,399,552 B1 | 6/2002 | Lee et al. | | 510/175 |
| 6,431,190 B1 | 8/2002 | Oka et al. | | 134/148 |
| 6,436,302 B1 | 8/2002 | Li et al. | | 216/38 |
| 6,443,168 B1 | 9/2002 | Morita et al. | | 134/105 |
| 6,447,633 B1 * | 9/2002 | Peace et al. | | 156/345.46 |
| 6,453,916 B1 | 9/2002 | Tran et al. | | 134/58 R |
| 6,479,879 B1 | 11/2002 | Pike et al. | | 257/437 |
| 6,494,221 B1 | 12/2002 | Sellmer et al. | | 134/147 |
| 6,497,784 B1 | 12/2002 | Jones et al. | | 156/345.12 |
| 6,516,815 B1 | 2/2003 | Stevens et al. | | 134/25.4 |
| 6,536,454 B2 | 3/2003 | Lindner | | 134/153 |
| 2003/0070755 A1 | 4/2003 | Emami | | 156/345.11 |
| 2003/0073320 A1 | 4/2003 | Emami | | 438/704 |

\* cited by examiner

APPARATUS AND METHOD FOR EDGE BEAD REMOVAL

This application is related to a pending application having Ser. No. 09/981,589. That application was also filed on Oct. 16, 2001, and is entitled "Improved Capillary Ring."

BACKGROUND OF THE INVENTION

1. Field of the Invention

The present invention relates to apparatuses and methods for conducting edge bead removal on semiconductor substrates. More particularly, the present invention relates to an apparatus and method for removing an edge bead from a substrate without staining the substrate as a result of a gas flow drying residue metal deposition chemicals on the substrate production surface.

2. Background of the Related Art

In semiconductor device manufacturing, multiple deposition processes, such as chemical vapor deposition (CVD), physical vapor deposition (PVD), electroless plating, electrochemical plating (ECP), and/or other deposition processes, are generally conducted in a process series in order to generate a multilayer pattern of conductive, semiconductive, and/or insulating materials on a substrate. When the series is used to manufacture a multilayer device, a planarization process is generally used to planarize or polish the substrate surface between the individual layer deposition steps in order to provide a relatively flat surface for the next deposition step. When an ECP process is used as a deposition step, an edge bead generally forms proximate the perimeter of the substrate, which inhibits effective planarization processes. Therefore, an edge bead removal (EBR) process is generally conducted after an ECP deposition process is complete. The EBR process generally operates to remove unwanted edge beads deposited on the bevel or edge of the substrate during the ECP deposition process, and therefore, allows for effective planarization of the substrate surface.

Metal ECP may be accomplished through a variety of methods using a variety of metals. Copper and copper alloys are generally a choice metal for ECP as a result of copper's high electrical conductivity, high resistance to electromagnetic migration, good thermal conductivity, and it's availability in a relatively pure form. Typically, electrochemically plating copper or other metals and alloys involves initially depositing a thin conductive seed layer over the substrate surface to be plated. The seed layer may be a copper alloy layer having a thickness of about 2000 Å, for example, and may be deposited through PVD or other deposition techniques. The seed layer generally blanket covers the surface of the substrate, as well as any features formed therein. Once the seed layer is formed, a metal layer may be plated onto/over the seed layer through an ECP process. The ECP layer deposition process generally includes application of an electrical bias to the seed layer, while an electrolyte solution is flowed over the surface of the substrate having the seed layer formed thereon. The electrical bias applied to the seed layer is configured to attract metal ions suspended or dissolved in the electrolytic solution to the seed layer. This attraction operates to pull the ions out of the electrolyte solution and cause the ions to plate on the seed layer, thus forming a metal layer over the seed layer.

During the ECP process, metal ions contained in the electrolyte solution generally deposit on substrate locations where the solution contacts the seed layer. Although the seed layer is primarily deposited on the front side of the substrate, the seed layer may be over deposited and partially extend onto the edge and backside of the substrate. As such, metal ions from the electrolyte solution may deposit on the edge and backside portions of the substrate during an ECP process if the electrolyte solution contacts these portions of the substrate having the over deposited seed layer formed thereon. For example, FIG. 1A illustrates a cross sectional view of a substrate 22 having a seed layer 32 deposited on the substrate surface 35. Seed layer 32 extends to a radial distance proximate the bevel edge 33 of substrate 22 and may be deposited, for example, with a CVD or a PVD process. A conductive metal layer 38 is deposited on top of seed layer 32, through, for example, an ECP process. As a result of the seed layer 32 terminating proximate bevel 33, an excess metal layer buildup, known as an edge bead 36, generally forms proximate the bevel 33 above the terminating edge of the seed layer 32. Edge bead 36 may result from a locally higher current density at the edge of seed layer 32 and usually forms within 2–5 mm from the edge of the substrate. FIG. 1B illustrates a similar edge bead 36, and includes an illustration of a metal layer 38 extending around the bevel 33 of substrate 22 onto backside 42. This situation occurs when the seed layer 32 extends around bevel 33 onto backside 42 and comes into contact with the electrolyte during ECP process. Edge bead 36 must generally be removed from the substrate surface before further layers may be deposited thereon or before substrate processing is complete, as edge bead 36 creates a deformity in the planarity of the substrate surface that does not facilitate multilayer device formation.

EBR systems operate to remove the over deposited seed and metal layers from the edge and backside portions of the substrate. Generally, there are two primary types of EBR systems. A nozzle-type EBR system generally rotates a substrate below a nozzle that dispenses a metal removing solution onto the edge and possibly backside of the substrate in order to remove the edge bead and over deposited metal layer. A capillary-type EBR system generally floats a substrate immediately above a plastic capillary ring configured to direct a metal removing solution dispensed on the backside of the substrate around the bevel area proximate the edge bead for removal thereof.

Although both types of EBR systems are generally effective in removing the edge bead and over deposited metal layer from the substrate, both systems suffer from inherent disadvantages. For example, in a conventional capillary EBR system, such as the system illustrated In U.S. Pat. No. 6,056,825 to SEZ Corporation, a substrate is floated face down on a substrate support member via a gas flow, which may be nitrogen, for example. The gas flow exits a substrate support surface below the substrate positioned thereon, thus acting as a gas cushion for the substrate that keeps the substrate from contacting the substrate support member. However, substrates placed in EBR systems generally have a copper sulfate liquid residue on the production surface of the substrate from previous metal layer deposition steps. Therefore, when the substrate is supported by the gas flow/cushion, the gas flow often acts to dry the copper sulfate residue, which causes staining on the production surface of the substrate. Staining is undesirable, as the electrical properties of the metal layers below the stain are degraded, which may reduce the device yield. In order to avoid staining of the production surface, the production surface may be rinsed with deionized water, for example, prior to the substrate being supported by the gas cushion. However, rinsing also presents disadvantages, as the production surface may then corrode or pit as a result of the exposure to the rinsing fluid. Further, fumes from the edge bead removal solution may contact the production surface, which may also cause undesirable pitting of the surface. Another disadvantage of capillary-type EBR systems is that the geometry of the plastic capillary ring has a substantial effect upon the EBR effectiveness. For example, if the plastic capillary ring is not completely planar, then the EBR process will be uneven around the perimeter of the substrate. This poses a significant disadvantage, as the plastic capillary ring is a common component that is removed during various types of system maintenance, and when the ring is reinstalled, often the surface is not planar as a result of various torques exerted on the plastic ring from the mounting hardware.

Therefore, there exists a need for a capillary EBR system capable of supporting a substrate in an EBR process without drying liquid chemical residues on the production surface of the substrate and causing staining thereof.

SUMMARY OF THE INVENTION

Embodiments of the invention generally provide an improved apparatus for removing an edge bead from a substrate. The apparatus includes a processing chamber having an edge bead removal fluid distribution system positioned therein and a substrate support member positioned in the processing chamber proximate the fluid distribution system. The substrate support member generally includes an upper substrate support surface having a plurality of fluid dispensing apertures formed therein, at least three capillary ring support posts radially positioned about a perimeter of the upper substrate support surface, and a annular capillary ring having a planar upper surface rigidly mounted to the capillary ring support posts. The substrate support member further includes at least three selectively extendable substrate support pin assemblies positioned proximate the annular capillary ring on the substrate support member, and at least three substrate gripper assemblies radially positioned about the perimeter of the upper substrate support surface.

Embodiments of the invention further provide a substrate support member for a capillary-type edge bead removal system. The substrate support member includes at least one fluid dispensing aperture formed in an upper surface of the substrate support member, a plurality of gas dispensing apertures formed into the upper surface, and a plurality support posts positioned along a perimeter of the substrate support member in an annular pattern. The support member further includes an annular capillary ring mounted to the support posts, a plurality of selectively actuated pin assemblies positioned along the perimeter of the substrate support member, and a plurality of gripper assemblies positioned along the perimeter of the substrate support member.

Embodiments of the invention further provide a method for removing an edge bead from a substrate. The method generally includes supporting a substrate in a face down position at a preferred capillary distance above an annular capillary ring with a plurality of selectively extendable substrate support pins and securing the substrate at the preferred capillary distance with a plurality of gripper assemblies. The method further includes rotating the substrate with the plurality of gripper assemblies, dispensing an edge bead removal solution onto a backside of the substrate, and generating a capillary flow of the edge bead removal solution in an area between a front surface of the substrate and an annular capillary ring that operates to remove the edge bead from the substrate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
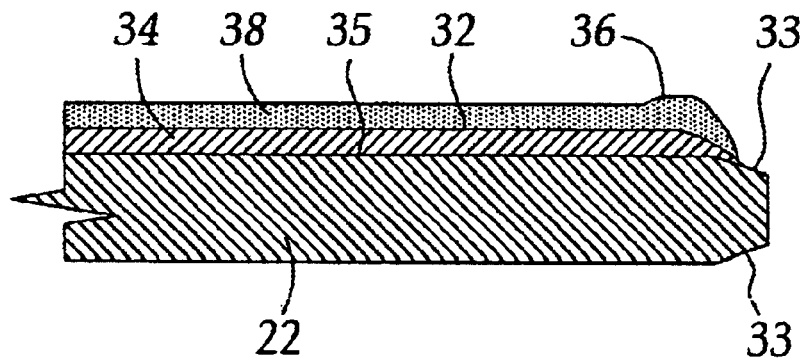
FIGS. 1A and 1B illustrate exemplary edge beads formed by electrochemical plating processes.
Figure 1B:
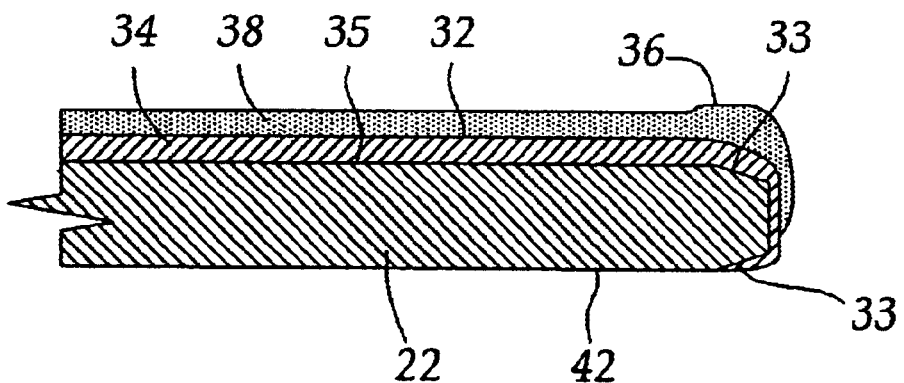
Figure 2A:
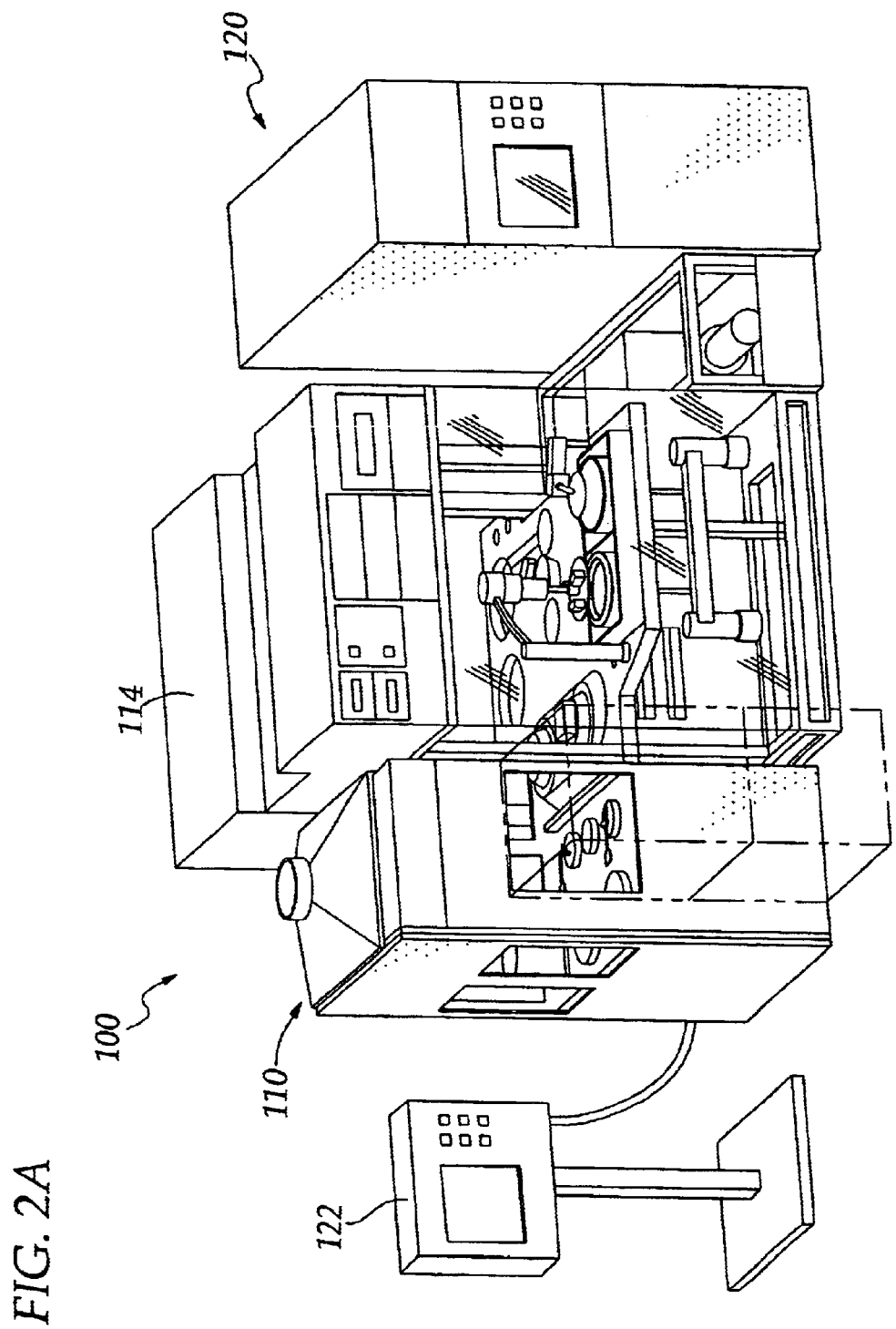
FIG. 2A illustrates a perspective view of an exemplary processing system incorporating the EBR chamber of the invention.

FIG. 2A illustrates a perspective view of a processing system incorporating an EBR chamber of the invention. System platform 100 generally includes a loading station 110, a thermal anneal chamber 111 (shown in FIG. 2B), a spin-rinse-dry (SRD) station 112, a mainframe 114, and an electrolyte/edge bead removal solution replenishing system 120. Preferably, the system platform 100 is enclosed in a clean room-type environment using, for example, plexiglass panels to separate platform 100 from the unfiltered environment. Mainframe 114 generally includes a mainframe transfer station having at least one transfer robot 116 positioned therein, along with a plurality of processing stations 118 positioned around robot 116. Each processing station 118 may include one or more receptacles or positions for receiving a processing cell or chamber 140, such as the EBR chamber of the invention. A fluid replenishing system 120, such as an electrolyte or deplating solution replenishing system, may be positioned adjacent system platform 100 and be in fluid communication with process cell or chamber 140 in order to circulate processing fluid thereto. System platform 100 also includes a control system 122, which may be a programmable microprocessor configured to interface with the various components of the system platform 100 and provide controlling signals thereto. Control system 122 may generally operate to control the cooperative operation of each of the components that together form system platform 100.

Figure 2B:
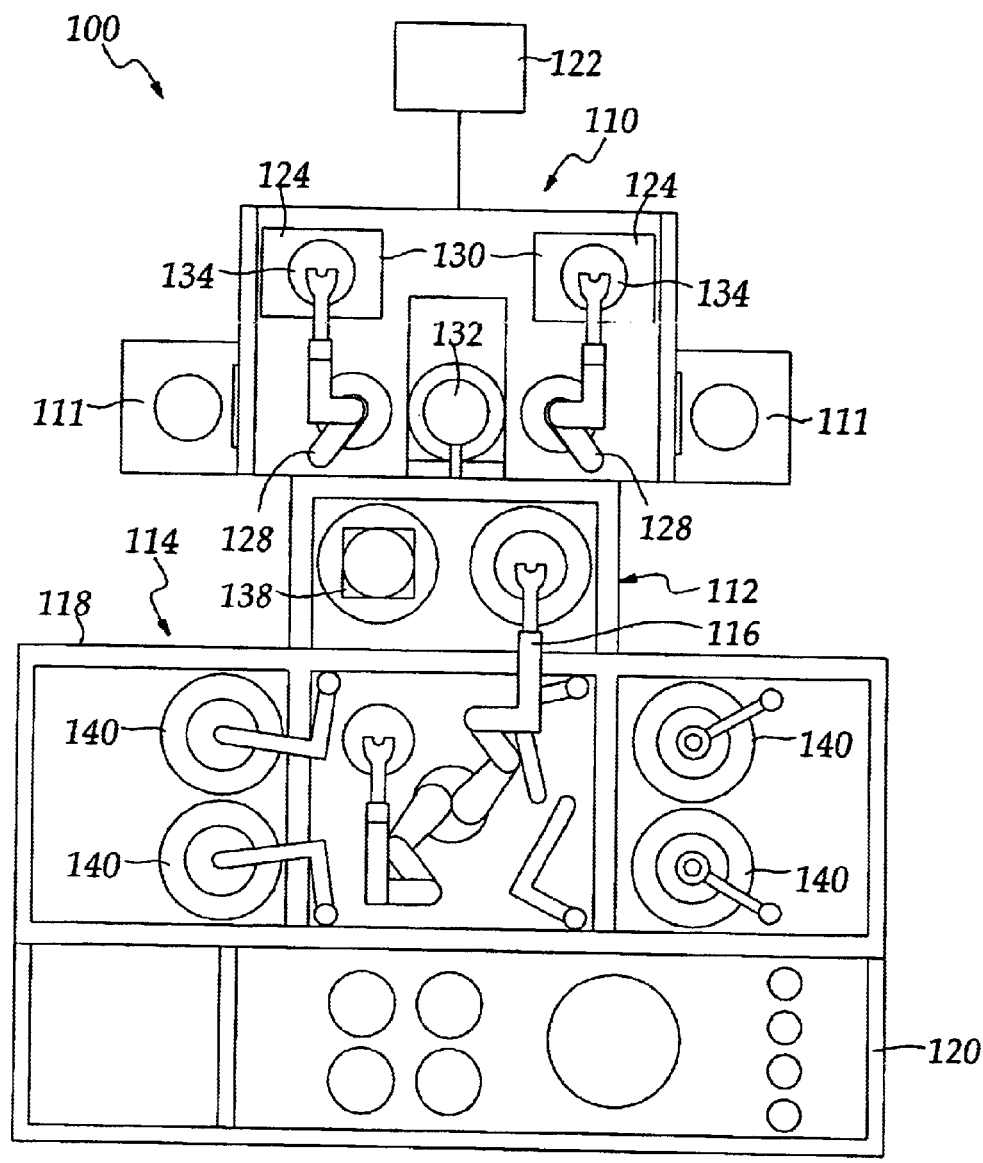
FIG. 2B illustrates a plan view of the exemplary processing system incorporating the EBR chamber of the invention.

Loading station 110 generally includes one or more substrate cassette receiving areas 124, one or more loading station transfer robots 128, and at least one substrate orientor 130. The number of substrate cassette receiving areas 124, loading station transfer robots 128, and substrate orientors 130 included in the loading station 110 may be configured according to the desired throughput of the system. As shown for one exemplary embodiment in FIGS. 2A and 2B, the loading station 110 includes two substrate cassette receiving areas 124, two loading station transfer robots 128, and one substrate orientor 130. Substrate cassettes 132 containing substrate 134 are loaded onto the substrate cassette receiving areas 124 in order to introduce substrates 134 into the system platform 100. The loading station transfer robots 128 then transfer substrates 134 between the substrate cassette 132 and the substrate orientor 130. The substrate orientor 130 positions each substrate 134 in a desired orientation to ensure that the substrate 134 is properly processed. The loading station transfer robot 128 also transfers substrates 134 between the loading station 110 and the SRD station 112 and between the loading station 110 and the thermal anneal chamber 111. Robot 116 may then be used to transfer substrates from leading station 110 to processing chambers 140. Once processing of substrates 134 is complete, substrates 134 may be returned to cassettes 132 for removal from system 100. Although FIGS. 2A and 2B illustrate an exemplary processing platform that may be used to implement the EBR chamber of the invention, the scope of the present invention is not limited to any specific processing platform. As such, other semiconductor processing systems, such as the Endura Platform, the Producer Platform, and the Centura Platform, all of which are available from Applied Materials Inc. of Santa Clara, Calif., for example, may also be used to implement the EBR chamber of the invention.

Figure 2C:
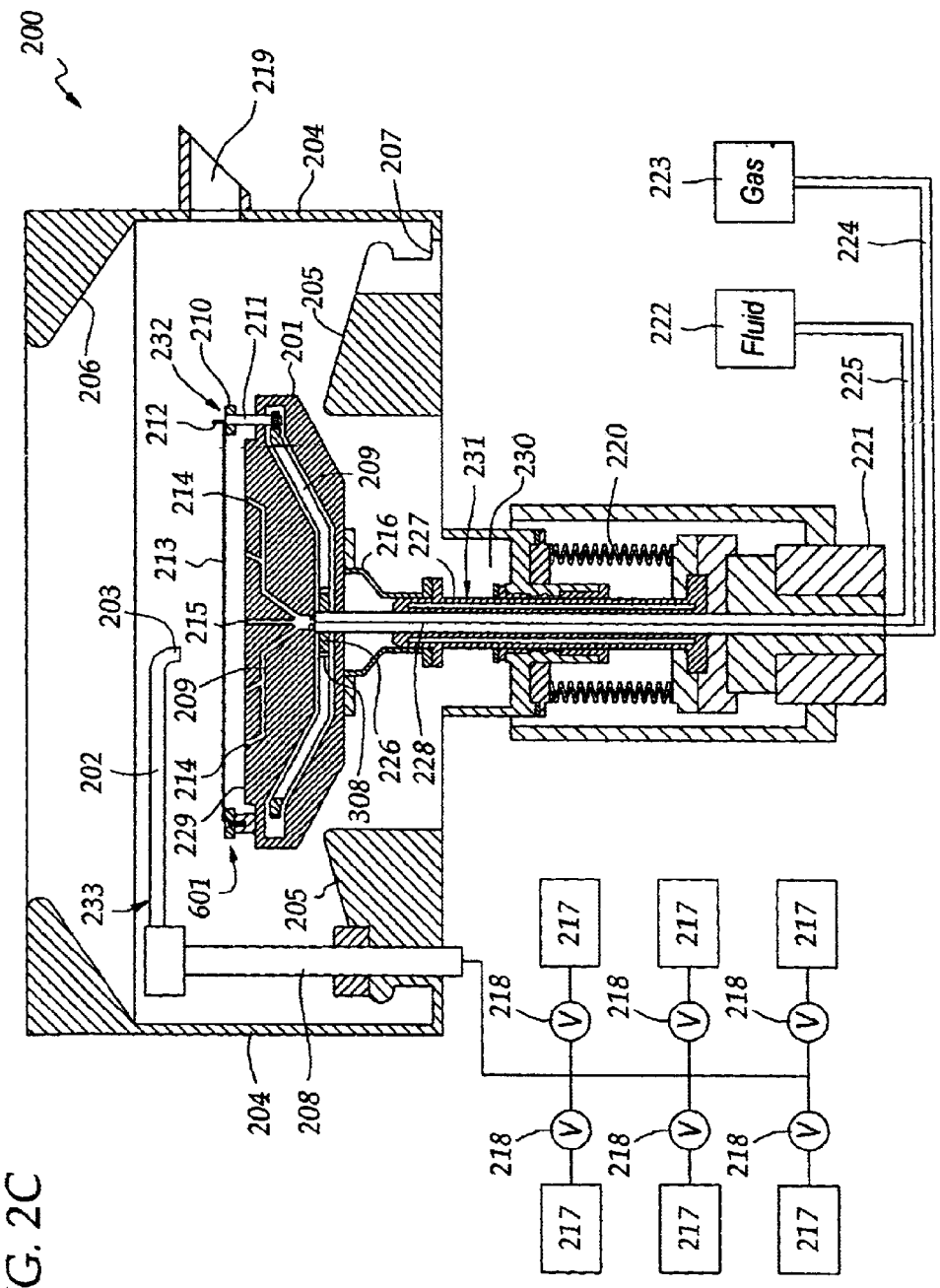
FIG. 2C illustrates a sectional view of an exemplary EBR chamber of the invention.

FIG. 2C illustrates a sectional view of an exemplary EBR chamber of the invention that may be used in system 100 at location 140, for example. Chamber 200 includes sidewalls 204, a bottom portion 205, and a top portion 206 that cooperatively form an interior portion of chamber 200. Top portion 206 may be configured to seal the interior portion of chamber 200 from the surrounding atmosphere in a pumped/vacuum chamber configuration, or alternatively, top portion may be configured to generally isolate the interior portion of chamber 200 from the atmospheric conditions surrounding the chamber without using a vacuum-type configuration. Bottom portion 205 generally includes an inclined region configured to direct fluids toward the outer perimeter of chamber 200 for collection by a fluid drain 207. Bottom portion 205 also includes a centrally located receiving member 230 configured to communicate a substrate support member 201 therethrough from the exterior of chamber 200 to the interior portion of chamber 200. Sidewall 204 includes a passageway 219 configured to allow a robot, such as robot 116, for example, to place substrates into chamber 200 for processing and remove substrates therefrom after the processing steps are complete. Passageway 219 may be selectively opened, and therefore, when passageway is in a closed position, the interior portion of chamber 200 is generally not in communication with the atmosphere surrounding chamber 200 through passageway 219.

Substrate support member 201 is centrally positioned within chamber 200. Substrate support member 201 generally includes an upper substrate support surface 229 (shown in FIG. 3A) and a lower support member shaft portion 231 that passes through receiving member 230 from the exterior of chamber 200 to the interior portion of chamber 200. Shaft member 231 includes a substantially hollow outer shaft 227 rotatably mounted in receiving member 230 and a substantially hollow inner shaft 228 rotatably mounted in the substantially hollow interior portion of outer shaft 227. Inner shaft 228 includes one or more fluid conduits 224, 225 formed in the substantially hollow interior portion of shaft 228. Fluid conduits 224, 225 operate to communicate fluids and/or gases from sources 222, 223 positioned outside chamber 200 to the upper surface 229 of substrate support member 201. Outer shaft 227 is independently in mechanical communication with a first drive motor 220 and inner shaft 228 is independently in mechanical communication with a second drive motor 221. Therefore, outer shaft 227 and inner shaft 228 may be selectively rotated independently of each other through selective activation of motors 220 and 221. An upper terminating end of outer shaft 227 is affixed to the main body of substrate support member 201, and therefore, when outer shaft 227 is caused to rotate by motor 220, substrate support member 201 rotates. An upper terminating end of inner shaft 228 includes an annular gear 226 axially affixed thereto. Annular gear 226 is configured to actuate a gripper assembly 232, which will be further discussed herein.

Upper surface 229 of support member 201 includes a centrally located fluid dispensing aperture 215 configured to dispense a fluid proximate the center of upper surface 229. Fluid dispending aperture 215 is in communication with fluid supply source 222, which may be a deionized water source or other fluid source(s) used in semiconductor manufacturing process, via a fluid conduit 225. Fluid conduit 225 is configured to communicate fluids from the respective fluid source 222, through the bottom portion 205 of chamber 200, into interior portion of chamber 200 via the interior portion of inner shaft 228. Fluid dispensing aperture 215 may be a single aperture positioned proximate the center of upper surface 229, or alternatively, fluid dispensing aperture 215 may comprise a plurality of fluid dispensing apertures 215 positioned about upper surface 229. Upper surface 229 also includes one or more gas dispensing nozzles 214 formed therein. Nozzles 214 may be radially positioned about upper surface 229 in a configuration designed to support substrate 213 on a gas flow cushion when a flow of gas is provided to nozzles 214. A gas flow, which may be nitrogen, for example, is supplied to nozzles 214 from gas source 223 via conduit 224, which runs into chamber 200 through the interior portion of inner shaft 228. At least three rotatable substrate gripper assemblies 232 are radially positioned about the perimeter of upper surface 229. Gripper assemblies, which will be further discussed herein, are generally in mechanical communication with annular gear 226, and therefore, gripper assemblies 226 cooperatively rotate with inner shaft 228.

A fluid dispensing assembly 233 operates to dispense a fluid onto a substrate 213 positioned on substrate support member 201. The fluid dispensed may be, for example, a metal removing solution, an etchant, an edge bead removal solution, or other chemical solution used in a semiconductor manufacturing process. Fluid dispensing assembly 233 generally includes a base member 208, a longitudinally extending arm member 202, and a fluid dispensing nozzle 203. Base member 208 may be rotatably or rigidly mounted at a lower end to either bottom portion 205 or side walls 204 of chamber 200. The top portion of base member 208 has a longitudinally extending fluid communicating arm 202 extending therefrom. The arm 202, which has a hollow interior portion, is in fluid communication with a hollow interior fluid conduit formed into base member 208. Arm 202 is also in fluid communication with the fluid dispensing nozzle 203 which is generally positioned at a distal end of arm 202 and is configured to dispense a fluid transmitted through base member 208 and arm member 202 onto substrate 213. The lower end of base member 208 may be in communication with a plurality of fluid sources 217 through selectively actuated valves 218. The combination of valves 218 and fluid sources 217 allows for a mixture of fluids/chemicals to be dispensed from nozzle 203. The fluid mixture process, i.e., the opening of the respective valves 218, may be controlled by a microprocessor based control system, such as controller 122, for example, or other known control systems.

Figure 3A:
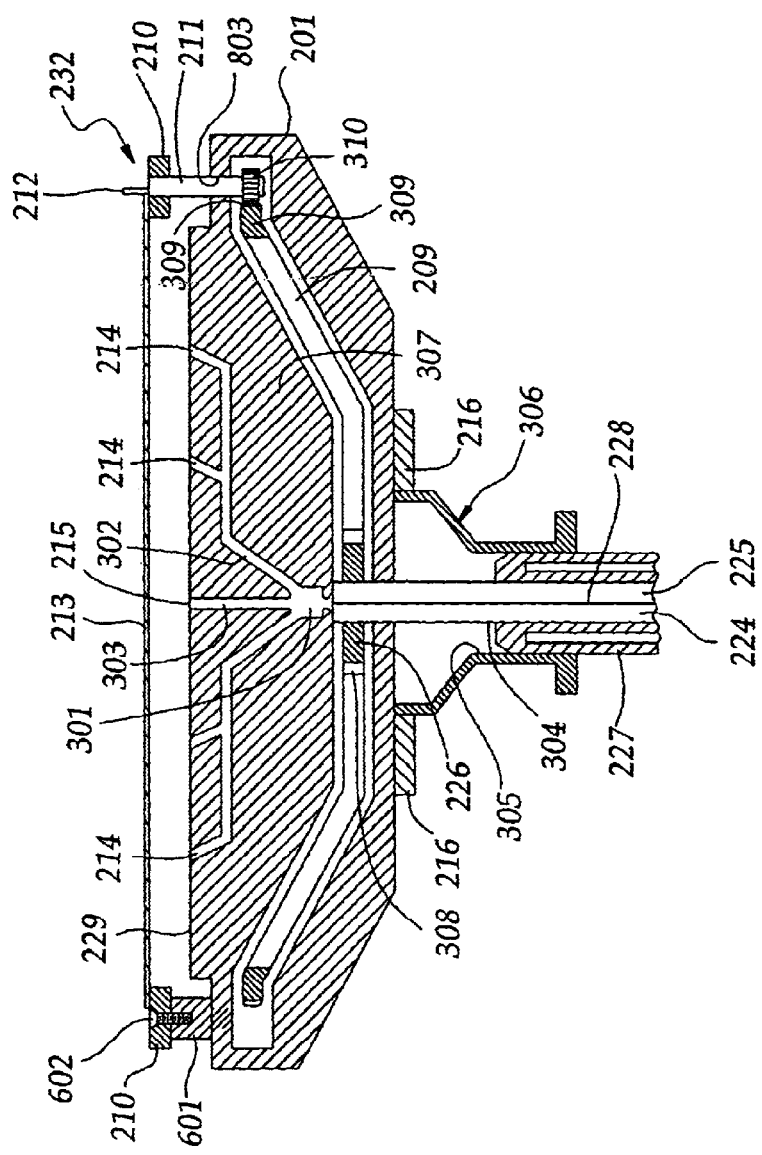
FIG. 3A illustrates a detailed sectional view of an exemplary substrate support member of the invention.
Figure 3B:
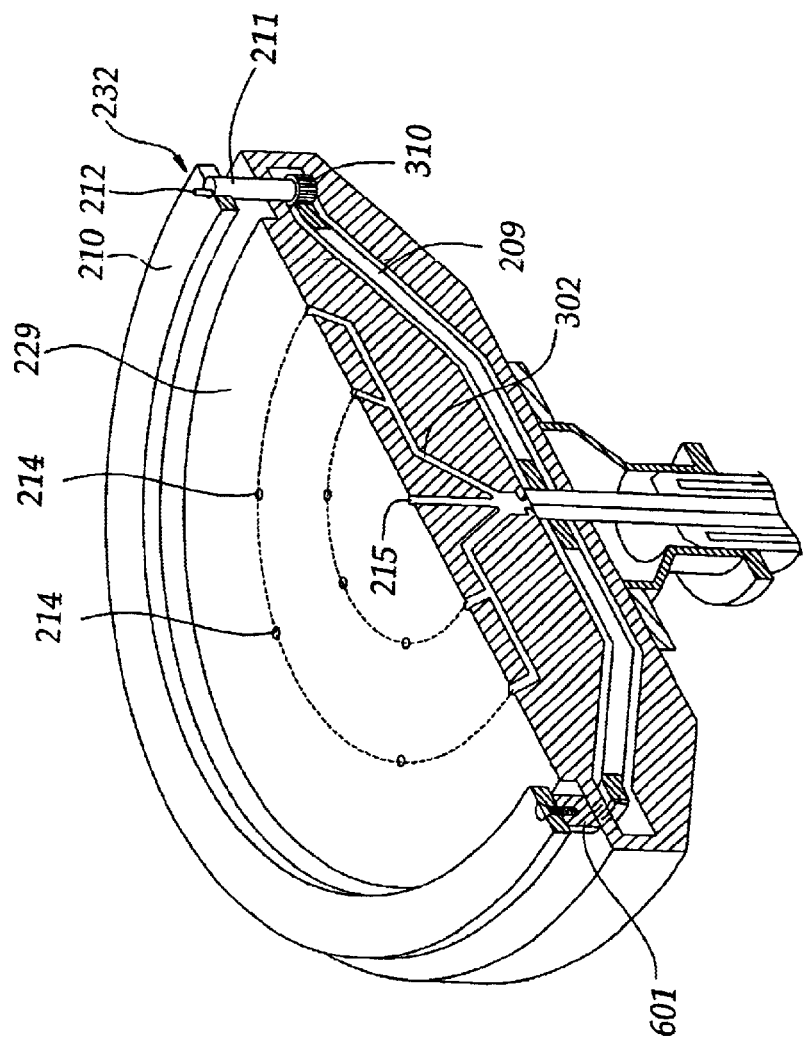
FIG. 3B illustrates a perspective view of an exemplary substrate support member of the invention.

FIG. 3A illustrates a detailed sectional view of an exemplary substrate support member 201 of the invention. Substrate support member 201 includes a main body portion 307 having an upper surface 229 that includes a plurality of radially positioned gas nozzles 214 and at least one fluid distribution nozzle 215 (shown in FIG. 2C formed thereon. Gas nozzles 214 are in fluid communication with a gas supply source 223 via conduit 224 in the interior portion of inner shaft 228 and conduit 302 formed in main body portion 307. The conduit 224 formed into inner shaft 228 makes fluid connection with conduit 302 formed in splitter block 301, which receives at least two fluid conduits from the interior portion of inner shaft 228 and outputs a corresponding number of separate fluid outputs. The fluid dispensing nozzle 215 is also in fluid communication with splitter block 301 via a conduit 303, and therefore, fluid dispensing nozzle 215 may receive fluids from fluid supply 222 via conduit 225 passing through the interior portion of inner shaft 228 and connecting to splitter block 301. Splitter block may be configured to receive several conduits from the interior portion of inner shaft 228 and transmit the fluids carried by the respective conduits to corresponding conduits formed into main body portion 307.

Main body portion 307 is in mechanical communication with outer shaft 227 via support member 306. Therefore, when outer shaft 227 is caused to rotate by first motor 220, main body portion 307 of substrate support member 201 is also caused to rotate. Inner shaft 228 is concentrically mounted within a substantially hollow interior portion of outer shaft 227 such that the outer surface 304 of the inner shaft 228 may slidably engage the inner surface 305 of outer shaft 227. Inner shaft 228 is in mechanical communication with second motor 221, and therefore, may be rotated independently of outer shaft 227. An annular gear 226 is axially affixed to the terminating end of inner shaft 228 and is configured to engage a drive gear 308 formed on a lower portion of cup-shaped gear member 209. Thus, when inner shaft is rotated, annular gear 226 rotates therewith while cooperatively engaging drive gear 308 and causing rotation thereof, which causes cup shaped gear 209 to proportionally rotate. The outer portion of cup-shaped gear 209 includes a geared surface 309 (shown in FIG. 4) configured to engage gripper assemblies 232. Each gripper assembly 232 used in the exemplary embodiment engages the geared surface 309, and therefore, each respective gripper assembly 232 rotates cooperatively with other gripper assemblies 232. In order to maintain equal spacing of the gripper assemblies 232, each of gripper assemblies 232 may be, for example, 120° apart, thus forming an equilateral triangle configuration when viewed in plan. The triangle configuration may be used to receive and engage a substrate between the respective gripper assemblies 232.

Figure 4:
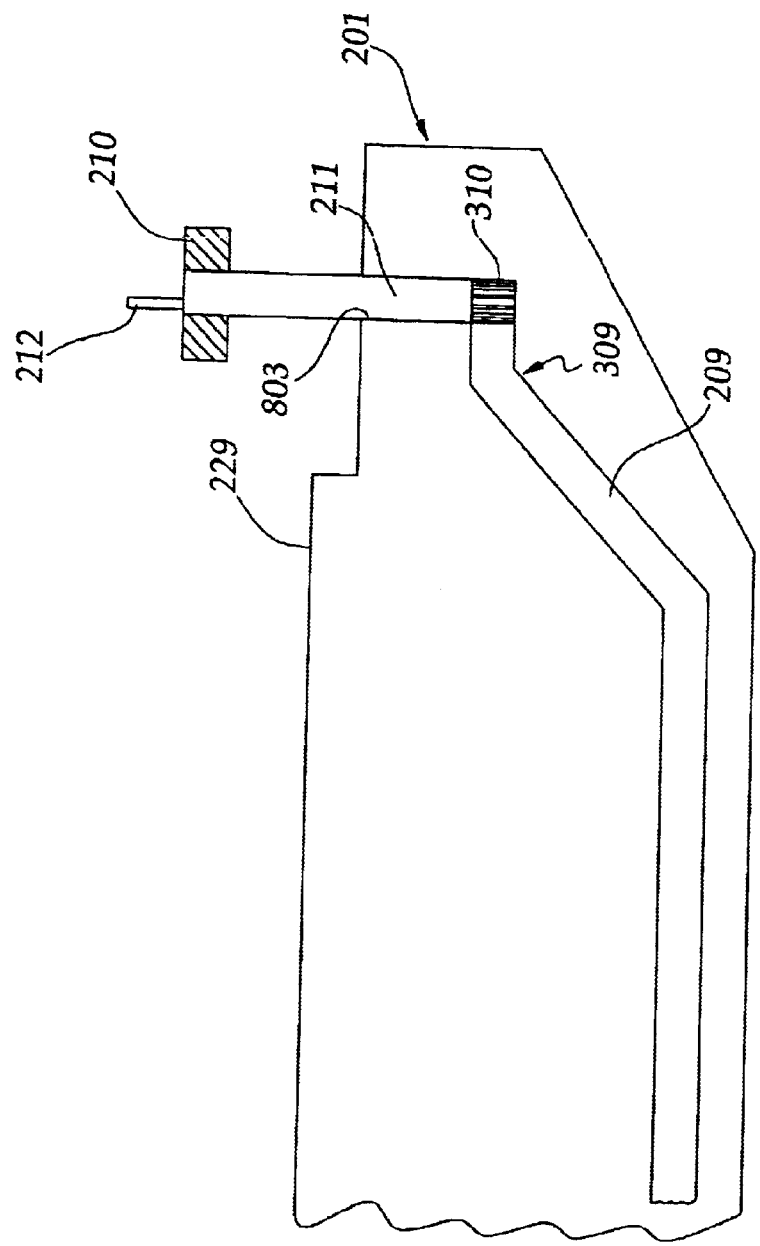
FIG. 4 illustrates a partial sectional view of an exemplary substrate support member proximate a gripper assembly.

Each gripper assembly 232 is positioned about the perimeter of upper surface 229 of substrate support member 201. Gripper assembly 232 generally includes a rotatably mounted gripper post 211 having a first and second terminating ends. The first end of gripper post 211 is attached to a gripper drive gear 310, as shown in FIG. 4. Gripper drive gear 310 engages the geared surface 309 of cup shaped gear 209, and therefore, gripper drive gear 310 cooperatively rotates with cup shaped gear 209. The second end of rotatably mounted gripper post 211 includes an eccentrically mounted substrate gripping members 212 extending therefrom in a direction parallel to the longitudinal axis of gripper post 211. As a result of the eccentric mounting position of gripping member 212, rotation of gripper post 211 causes gripping member 212 to eccentrically rotate about the longitudinal axis of the gripper post 211. Therefore, when a plurality of gripper assemblies 232 are implemented, the gripper assemblies 232 may operate to cooperatively secure a substrate for processing. For example, a substrate may be positioned immediately above substrate support surface 229 by a robots and inner shaft 228 may be rotated in order to cause each of eccentrically mounted gripper members 212 to rotate toward the center of substrate support member 201. This cooperative rotation of the plurality of gripper members 212 may be used to secure a substrate between the respective gripper members 212 as they rotate and close the substrate therebetween. Gripper posts 211 generally extend upward above upper support surface 229, and therefore, posts 211 generally pass through capillary ring 210. Therefore, capillary ring 210 generally includes a plurality of gripper post holes 803 formed therein, where the gripper post holes 803 are configured to communicate gripper post 211 therethrough to the upper side of capillary ring 210.

Figure 5:
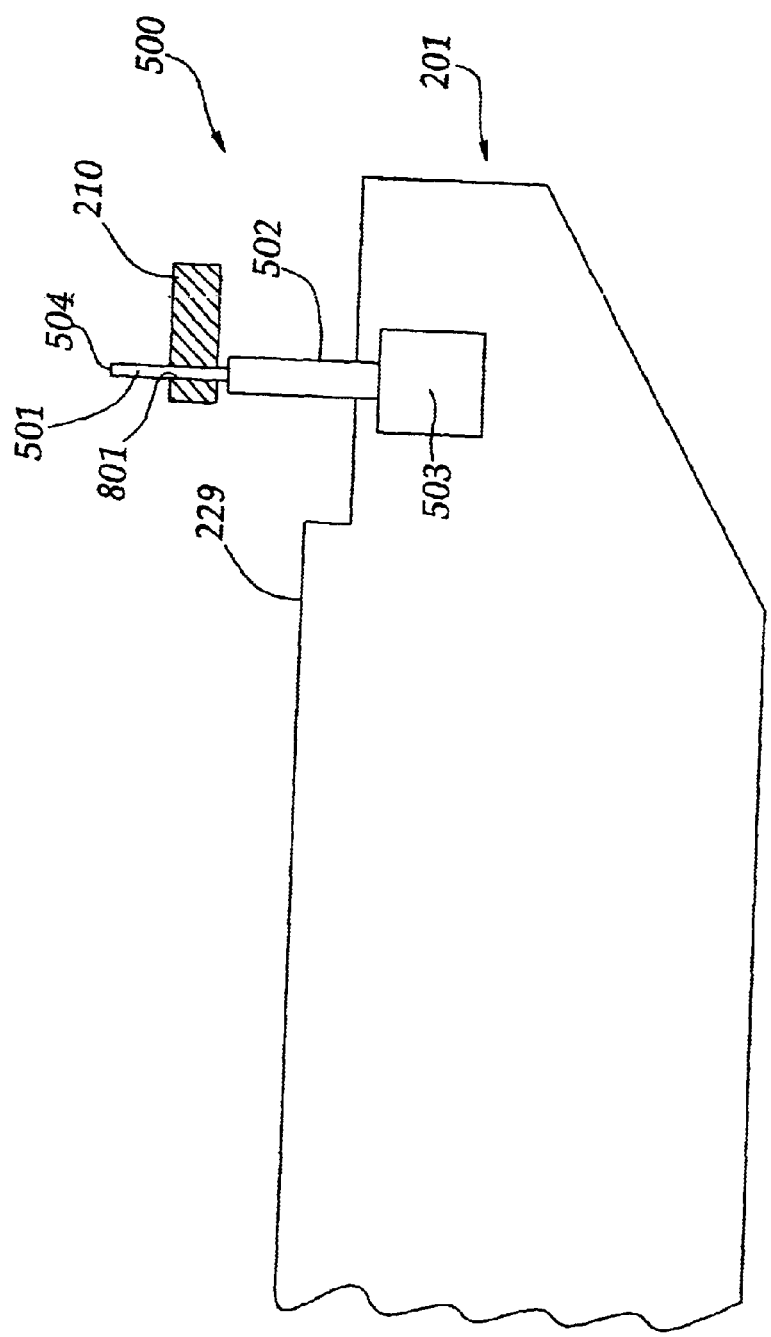
FIG. 5 illustrates a partial sectional view of an exemplary substrate support member proximate a substrate support pin.
Figure 8:
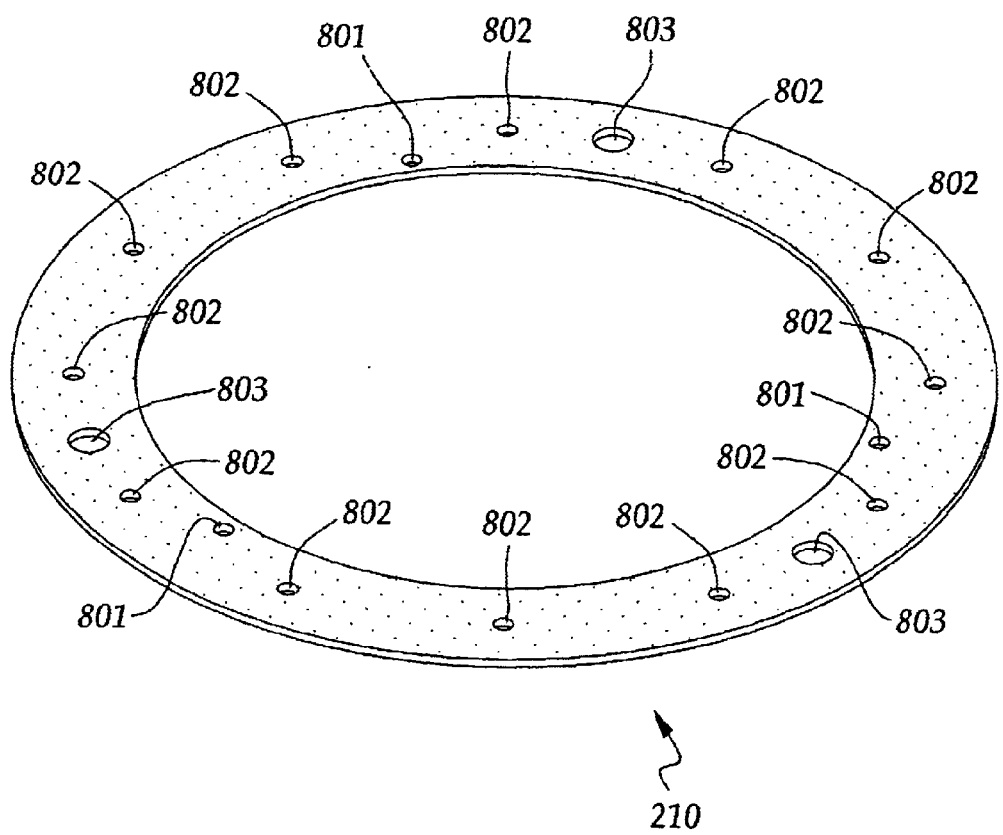
FIG. 8 illustrates a perspective view of an exemplary capillary ring of the invention.

Substrate support surface 229 also includes at least three selectively extendable substrate support pin assemblies 500 positioned proximate the perimeter of upper surface 229, as illustrated in FIG. 5. Each of pin assemblies 500 generally includes an actuator device 503, an actuator rod 502, and a substrate support pin 501. Actuator device 503, which is generally positioned below upper surface 229 within the body of support member 201, operates to actuate rod 502 longitudinally. Actuator device 503, therefore, may be an air actuated actuator, an electrically actuated actuator, or other type of actuator configured to impart longitudinal motion to actuator rod 502. Actuator rod 502 generally comprises a cylindrical rod configured to mechanically engage an output of actuator device 503 and communicate this output to substrate support pin 501 attached thereto. Therefore, pin assemblies 500 may cooperatively support a substrate immediately above upper surface 229 when each of the respective support pins 501 are extended so that the terminating surfaces 504 of pins 501 may cooperatively engage a substrate and provide support thereto. The body portion of capillary ring 210 may include a number of pin bores 801 formed therethrough, as illustrated in FIG. 8, where each pin bore 801 is configured to receive and communicate a pin 501 therethrough upon actuation of pin 501 by actuator 503. The terminating end 504 of pin 501 may therefore extend through pin bore 801 formed into ring 210 and engage a substrate positioned above ring 210. Each of assemblies 500 may be equally positioned about the perimeter of upper surface 229. For example, if three pin assemblies 500 are used, each pin assembly 500 may be spaced 120° from each of the adjacent pin assemblies, thus forming an equilateral triangle between the respective pin assemblies 500 in plan view. Although various spacing configurations may be used, each spacing configuration should be configured to receive a substrate between the respective assemblies 500.

Figure 7:
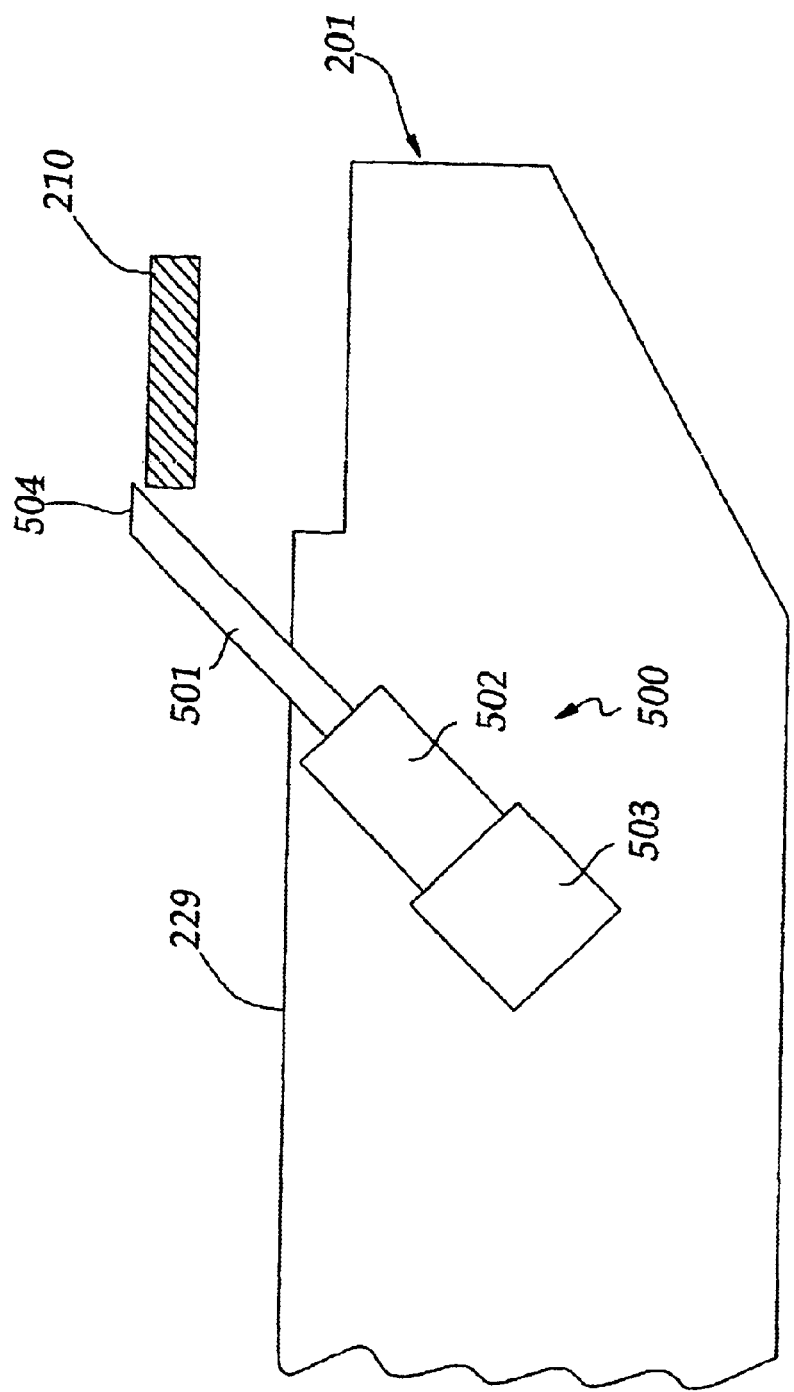
FIG. 7 illustrates a partial sectional view of an alternative exemplary substrate support member proximate a substrate support pin.

FIG. 7 illustrates an alternative embodiment of pin assemblies 500. In the embodiment illustrated in FIG. 7, pin assemblies 500 are angled with respect to the upper surface 229. As a result of the angle of pin assemblies 500, pin 501 does not travel through capillary ring 210 in the process of engaging a substrate. Rather, pin 501 engages the substrate with terminating end 504, which may be angled to present a surface that is parallel to the substrate being engaged, by longitudinally extending the actuator rod 502 from the actuator 503 at an angle calculated to contact the substrate without contacting the capillary ring 210. Therefore, the present invention contemplates that pins 501 may be positioned to travel vertically from substrate surface 229 through ring 210 to contact a substrate (FIG. 5), or alternatively, upward from upper surface 229 at an angle calculated to contact the substrate, either through ring 210 or bypassing ring 210 (FIG. 7). Further, pins 501 may extend toward the substrate from a position radially inward from ring 210 (FIG. 5), or alternatively, from a position radially inward from ring 210 (FIG. 7).

Figure 6:
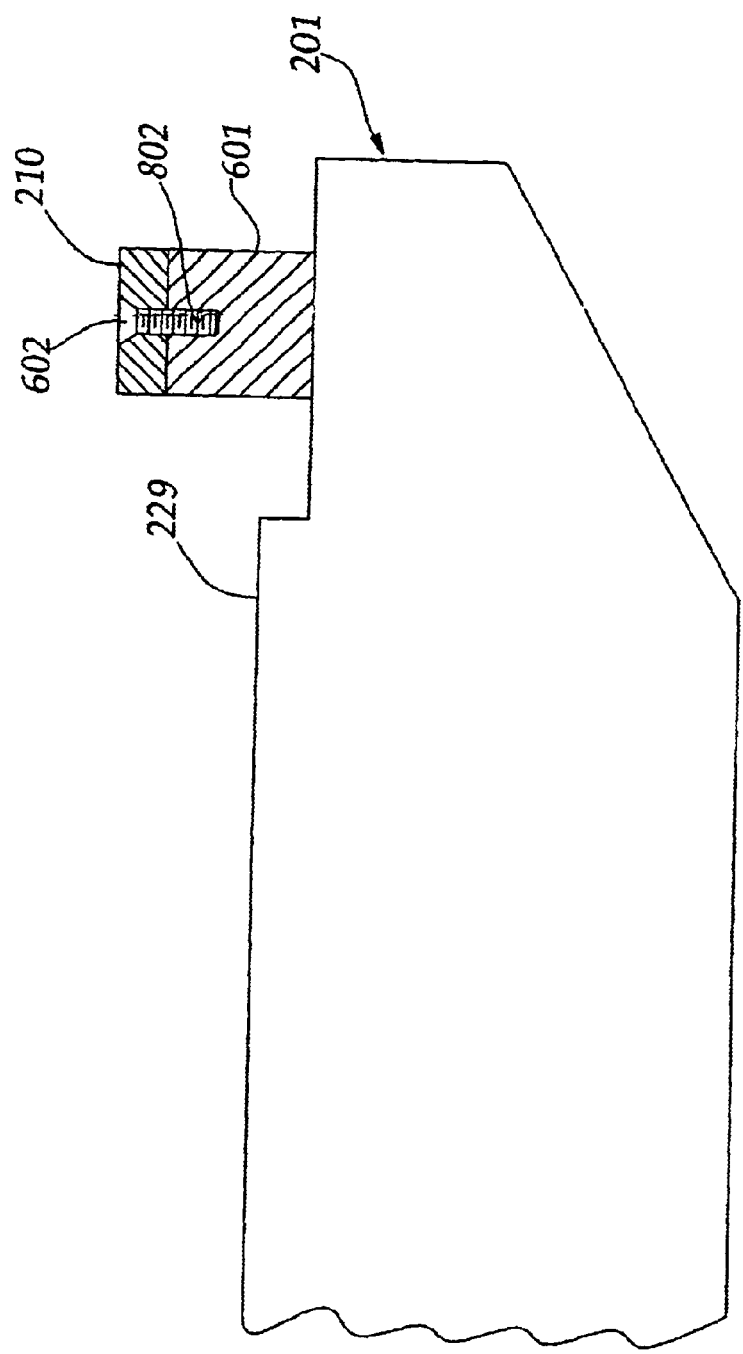
FIG. 6 illustrates a partial sectional view of an exemplary substrate support member proximate a capillary ring mounting post.

Substrate surface 229 also includes a plurality of mounting posts 601 configured to support the annular capillary ring 210 above upper surface 229, as shown in FIG. 6. Annular capillary ring 210, which is shown in FIG. 8, may be manufactured from a rigid material, such as aluminum, stainless steel, titanium, carbon steel, nickel, or hard plastic compound, such as nylon and Teflon compounds, for example. Further, if ring 210 is manufactured from a material that chemically reacts with known EBR solutions, then ring 210 may be coated with a non-reactive material in order to eliminate reactivity with the EBR solution used in the process. The material and structure of ring 210 is generally calculated to be sufficiently rigid as to not deform during and immediately after the mounting process. Therefore, the rigidity of ring 210 allows the support member of the invention to be disassembled and reassembled for processing without encountering varied processing results generated from deflection of ring 210 in the installation process. Mounting posts 601, which structurally support ring 210 in several locations, may be cylindrical posts rigidly affixed to the upper surface 229 of substrate support member 201. Posts 601 include a bore formed therein configured to receive a threaded mounting rod 602. Mounting rod 602 may be used to rigidly secure ring 210 to post 601 via mounting bores 802 formed into capillary ring 210. Upper surface 229 may include, for example, twelve mounting posts 601 equally spaced about the perimeter of upper surface 229. As such, each of the twelve posts 601 may be 30° apart from each adjacent post and may be configured to individually engage and secure a portion of capillary ring 210 thereto via threaded mounting rod 602. The cooperative engagement of capillary ring 210 by the plurality of posts 601 provides a nearly continuous mounting surface for capillary ring 210, which facilitates capillary ring 210 maintaining a planar configuration. Ring 210 includes a plurality of bores 803, 802 and 801 formed therein configured to receive the gripper assemblies 232, mounting posts 601, and pins 501 therethrough, respectively. More particularly, for example, ring 210 may include three gripper assembly holes 803 equally spaced/positioned about a radius of ring 210. Ring 210 may further include three pin receiving holes 801 equally spaced/positioned about a radius of ring 210. The radius of pin receiving holes will generally be proximate the radius of the inner diameter of ring 210, as it is desirable to maintain pin receiving holes proximate the inner radius of ring 210 so that pins 501 may engage a substrate positioned thereon in the edge or exclusion region of the substrate. Ring 210 may also include a plurality, twelve, for example, of ring mounting holes 802 equally spaced/positioned about a radius of ring 210. Mounting holes 802 are generally configured to receive threaded rod 602 therethrough in order to secure ring 210 to substrate support 201.

In operation, EBR chamber 300 is configured to receive a substrate 213 for removal of an edge bead 36 therefrom, after a metal deposition process, for example. Substrate 213 is transferred into EBR chamber 300 via robot 216, for example, where robot 116 is configured to access the interior of chamber 300 via passageway 219. Robot 216 operates to position substrate 213 in a face down configuration immediately above upper surface 229 of substrate support member 201. Grippers 212 (shown in FIG. 2C) are cooperatively rotated to an open position, i.e., a position where the distance from the center of upper surface 229 to each of grippers 212 is greater than the outer radius of substrate 213. Actuator 503 (shown in FIGS. 5 and 7) operates to extend pins 501 to a position where the substrate engaging ends 504 of pins 501 are extended above capillary ring 210. Once pins 501 are extended, robot 116 lowers substrate 213 onto pins 501, and robot 116 exits chamber 300. Once substrate 213 is positioned on pins 501, gripper assemblies 232 close to secure and center substrate 213 between the respective gripper assemblies 232. Once substrate 213 is secured and centered, pins 501 may be retracted by actuators 503 and the substrate 213 may be supported by grippers 212. Substrate support member 201 may then be rotated through actuation of first motor 220, and a rinsing solution, such as deionized water, for example, may be dispensed onto the production surface of substrate 213 via aperture 215. The substrate support member may be rotated at a relatively low rate, such as about 50 to about 500 RPM, for example, and a rinsing solution may be dispensed from dispensing aperture 215 positioned proximate the center of upper surface 229. The position of substrate 213 proximate upper surface 229, in conjunction with the rotation of substrate support 201, causes the rinsing solution to flow outward from dispensing aperture 215 toward the perimeter of substrate 213. This outward flow of the rinsing solution causes the entire surface of substrate 213 to be rinsed of residue metal deposition chemicals, such as copper sulfate, for example.

In order to prevent corrosion of the production surface of the substrate that may result from either the rinsing step or the fumes generated during the EBR step, the rinsing step may include dispensing an inhibiting agent or other additive used to prevent corrosive affects in conjunction with the rinsing solution. Exemplary inhibiting agents may be benzotirazol (BTA), toluenetriazol (TTA), or other inhibitors used in semiconductor manufacturing processes. BTA and TTA, for example, are known to form a protective barrier-type layer over a substrate surface that prevents corrosion thereof. This barrier-type layer is generally sufficient to repel most corrosive agents, while also being easily removed with ordinary etch or deposition solutions. Therefore, the BTA or TEA layer may be mixed with the DI during the rinsing process to form the barrier layer, and thereafter, the barrier layer may be easily removed during the next etch or metal deposition process where an etch or metal deposition solution is applied to the substrate surface. Concentration of the BTA and/or TTA may be in the range of about 0.1% to about 5.0%. A concentration of about 0.5% of BTA and/or TTA generally produces a barrier layer sufficient to repel corrosion. Although relatively small concentrations, i.e., about 0.3% to about 1.0%, are generally sufficient to form the protective layer, greater/larger concentrations may be implemented with effectiveness. However, larger concentrations proportionally increase the manufacturing cost, generally without providing a proportional increase level of protection. Once substrate 213 has been rinsed and an inhibitor applied, the surface of substrate 213 is dried through application of nitrogen and isopropyl alcohol (IPA) through apertures 214. The nitrogen gas flow in combination with the IPA operates to remove any moisture from the substrate surface. Substrate support 201 may also be rotated at a relatively high rate, up to about 3000 RPM, for example, during the drying process. This rotation generates substantial centrifugal force that operates to further physically remove moisture from the substrate surface.

Once the substrate surface has been cleaned and dried, the surface is prepared for the EBR process. However, since system 300 is a capillary-type EBR system, prior to initiating the EBR process, the capillary height (the distance from the upper surface of capillary ring 210 to the EBR region of substrate 213) must be set. Therefore, if the height of substrate 213 is not already at the appropriate height for optimal capillary action in the EBR region, then gripper assemblies 232 may be rotated to an open position and pins 501 may be extended to support substrate 213. Pins 501 may then be extended to a height calculated to provide optimal capillary action between substrate 213 and capillary ring 210. Once substrate 213 is at the appropriate height, gripper assemblies 232 may again close and pins 501 may be retracted so that gripper assemblies 232 support substrate 213. Once substrate 213 is positioned the respective gripper assemblies 232 at the appropriate capillary height, substrate support member 201 is rotated and an edge bead removal solution is flowed onto the backside of substrate 213 from nozzle 203 (shown in FIG. 2C). Substrate support 201 may be rotated at between about 100 RPM and about 1500 RPM during this process. The rotation of substrate support 201 causes the edge bead removal solution to flow radially outward across the backside of substrate 213. When the edge bead removal solution flows over the outer edge of substrate 213, a portion of the solution flows between the bevel portion 33 of substrate 213 and capillary ring 210 proximate the exclusion zone of substrate 213. The flow of the solution between ring 210 and the exclusion zone of substrate 213, which is generally termed a capillary flow, operates to remove the edge bead 36 and any over deposited metal layers from bevel portion 33 of substrate 213. Once the edge bead 36 and over deposited metal layers are removed, substrate 213 may again be rinsed with DI and an inhibitor solution, for example. The rinsing fluid may be dispensed from aperture 215 and/or nozzle 203, such that both the front side and back side of substrate 213 are rinsed of the EBR solution applied to remove the edge bead. Additionally, substrate 213 may be spin-rinse dried through high speed rotation of substrate support member 201 during the rinsing process.

Although the above discussion uses a single application of the EBR removal fluid, the EBR process may be continued through multiple removal steps. For example, substrate 213 may be rotated/shifted in gripper assemblies 232 and another EBR process initiated. The rotation/shift process may generally include rotating gripper assemblies 232 to an open position and supporting substrate 213 with pins 501, which may be extended to engage substrate 213. Substrate 213 may then be rotated, through application of a gas flow from apertures 214, for example, and gripper assemblies 232 may then be rotated to re-engage substrate 213. Thereafter, the EBR removal solution may be reapplied to the backside of substrate 213 by nozzle 203. Once the final EBR step is complete, substrate 213 may be finally rinsed and spun dry.

Robot 116 may then remove substrate 213 from chamber 300 via passageway 219.

While foregoing is directed to the preferred embodiment of the present invention, other and further embodiments of the invention may be devised without departing from the basic scope thereof, and the scope thereof is determined by the claims that follow.

What is claimed is:

1. An apparatus for removing an edge bead from a substrate, comprising:
    a processing chamber having an edge bead removal fluid distribution system positioned therein; and
    a substrate support member positioned in the processing chamber proximate the fluid distribution system, the substrate support member comprising:
        an upper substrate support surface having a plurality of fluid dispensing apertures formed therein;
        at least three capillary ring support posts radially positioned about a perimeter of the upper substrate support surface;
        an annular capillary ring rigidly mounted to the capillary ring support posts, the capillary ring having a planar upper surface;
        at least three selectively extendable substrate support pin assemblies positioned proximate the annular capillary ring on the substrate support member; and
        at least three substrate gripper assemblies radially positioned about the perimeter of the upper substrate support surface.

2. The apparatus of claim 1, wherein the fluid distribution system comprises a fluid distribution nozzle in communication with an edge bead removal solution source, the fluid distribution nozzle being positioned to distribute the edge bead removal solution on a backside of the substrate.

3. The apparatus of claim 1, wherein the plurality of fluid dispensing apertures comprises:
    a plurality of gas apertures radially positioned about the upper substrate support surface and being configured to generate a gas flow cushion sufficient to laterally support a substrate; and
    at least one rinsing solution aperture positioned proximate a central portion of substrate support member.

4. The apparatus of claim 1, wherein the selectively extendable substrate support pin assemblies comprise:
    an actuator positioned in the substrate support member; and
    a longitudinally extending substrate support pin having a distal substrate support surface formed thereon.

5. The apparatus of claim 4, wherein the actuator comprises at least one of an air actuated actuator, a fluid actuated actuator, and an electrically actuated actuator.

6. The apparatus of claim 4, wherein the actuator is configured to selectively extend the substrate support pin a predetermined distance above the annular capillary ring.

7. The apparatus of claim 4, wherein the longitudinally extending substrate support pin is configured to extend through a bore formed in the annular capillary ring.

8. The apparatus of claim 4, wherein the longitudinally extending substrate support pin is configured to extend proximate an edge of the annular capillary ring.

9. The apparatus of claim 1, wherein the gripper assemblies each comprise a selectively rotatable gripper post having a substrate gripping member eccentrically mounted to a distal end of each gripper post.

10. The apparatus of claim 1, wherein each of the gripper assemblies comprises:

a rotatably mounted gripper post having a first end and a second terminating ends;

a gripper drive gear mounted on the first terminating end; and a substrate gripping member eccentrically mounted on the second terminating end, the substrate gripper member extending longitudinally in a direction substantially parallel to the gripper post.

11. The apparatus of claim 10, further comprising:

a cup shaped gear rotatably mounted in the substrate support member, the cup shaped gear having a geared surface about the perimeter thereof, the geared surface engaging the gripper drive gear; and a first rotatably mounted shaft rigidly attached to the cup shaped gear, wherein the first rotatably mounted shaft is configured to cooperatively rotate the cup shaped gear and the gripper drive gear.

12. A substrate support member for a capillary-type edge bead removal system, comprising:

at least one fluid dispensing aperture formed in an upper surface of the substrate support member;

a plurality of gas dispensing apertures formed into the upper surface;

a plurality support posts positioned along a perimeter of the substrate support member in an annular pattern;

an annular capillary ring mounted to the support posts;

a plurality of selectively actuated pin assemblies positioned along the perimeter of the substrate support member; and a plurality of gripper assemblies positioned along the perimeter of the substrate support member.

13. The substrate support member of claim 12, wherein selectively actuated pin assemblies comprise:

an actuator positioned on the substrate support member; and an elongated substrate support pin affixed to an actuating rod of the actuator.

14. The substrate support member of claim 13, wherein the actuator further comprises at least one of an air actuated actuator, an electrically actuated actuator, and a fluid actuated actuator.

15. The substrate support member of claim 13, wherein the actuator is configured to selectively extend the substrate support pin to engage and support a substrate with a distal end of the support pin.

16. The substrate support member of claim 13, wherein the actuator is configured to extend the support pin to a predetermined height corresponding to a preferred capillary distance.

17. The substrate support member of claim 13, wherein the substrate support pin is configured to cooperatively engage and extend through a bore formed in the annular capillary ring while support a substrate.

18. The substrate support member of claim 13, wherein the substrate support pin is configured to extend proximate the annular capillary ring to engage and support a substrate at a preferred capillary distance above the annular capillary ring.

19. The substrate support member of claim 12, wherein the gripper assemblies comprise a rotatable post having an eccentrically mounted substrate gripping member longitudinally mounted thereto.

20. The substrate support member of claim 19, wherein the plurality of gripper assemblies are configured to cooperatively secure a substrate therebetween at a preferred capillary distance above the annular capillary ring.

21. The substrate support member of claim 12, further comprising:

a first rotatably mounted shaft in communication with the substrate support member and being configured to impart rotational motion thereto; and a second rotatably mounted shaft, the second shaft being concentrically positioned with the first rotatably mounted shaft, the second shaft being configured to actuate the plurality of gripper assemblies through a cup shaped gear.

* * * * *